(12) United States Patent
Takahashi

(10) Patent No.: US 7,625,779 B2
(45) Date of Patent: Dec. 1, 2009

(54) METHOD OF MANUFACTURING A SEMICONDUCTOR DEVICE INCLUDING A SEMICONDUCTOR CHIP HAVING AN INCLINED SURFACE

(75) Inventor: Noriyuki Takahashi, Nanae (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/003,348

(22) Filed: Dec. 6, 2004

(65) Prior Publication Data
US 2005/0140006 A1    Jun. 30, 2005

(30) Foreign Application Priority Data
Dec. 26, 2003    (JP)    ............... 2003-433603

(51) Int. Cl.
*H01L 21/44*    (2006.01)
*H01L 21/48*    (2006.01)
(52) U.S. Cl. .................. 438/109; 438/110; 257/686
(58) Field of Classification Search ............ 438/11, 438/14–15, 18, 113, 458, 462, 109–110, 438/106–107; 257/734, 48, 620, 618, 686, 257/E21.502, E21.499, E21.519, E25.006; 439/70, 723, 73
See application file for complete search history.

(56) References Cited

U.S. PATENT DOCUMENTS

| | | | | |
|---|---|---|---|---|
| 5,816,828 A | * | 10/1998 | Ikeya et al. | ............... 439/73 |
| 5,936,418 A | * | 8/1999 | Ideta et al. | ............... 324/755 |
| 6,218,849 B1 | * | 4/2001 | Kiyokawa | ............... 324/755 |
| 6,271,598 B1 | * | 8/2001 | Vindasius et al. | ............ 257/777 |
| 6,455,920 B2 | * | 9/2002 | Fukasawa et al. | ............ 257/620 |
| 6,482,730 B1 | * | 11/2002 | Masumoto et al. | ........... 438/617 |
| 6,535,002 B2 | * | 3/2003 | Haseyama et al. | ........... 324/754 |
| 6,770,543 B2 | * | 8/2004 | Nakamura | ............... 438/460 |
| 6,852,607 B2 | * | 2/2005 | Song et al. | ............... 438/464 |
| 6,884,642 B2 | * | 4/2005 | Farnworth et al. | ............ 438/15 |
| 6,887,723 B1 | * | 5/2005 | Ondricek et al. | .............. 438/14 |
| 6,900,079 B2 | * | 5/2005 | Kinsman et al. | ............. 438/127 |

FOREIGN PATENT DOCUMENTS

JP    2000-294607    10/2000

* cited by examiner

*Primary Examiner*—Theresa T Doan
(74) *Attorney, Agent, or Firm*—Miles & Stockbridge P.C.

(57) ABSTRACT

Chipping of semiconductor chips is to be prevented. A semiconductor device comprises a semiconductor chip having a main surface, a plurality of pads formed over the main surface, a rearrangement wiring formed over the main surface to alter an arrangement of the plurality of pads, and a protective film and an insulating film formed over the main surface, and a plurality of solder bumps each connected to the rearrangement wiring and arranged differently from the plurality of pads. The presence of a bevel cut surface obliquely continuous to the main surface and formed on a periphery of the main surface of the semiconductor chip prevents chipping.

14 Claims, 16 Drawing Sheets

METHOD OF MANUFACTURING A SEMICONDUCTOR DEVICE INCLUDING A SEMICONDUCTOR CHIP HAVING AN INCLINED SURFACE

CROSS-REFERENCE TO RELATED APPLICATION

The present application claims priority from Japanese patent application No. 2003-433603 filed on Dec. 26, 2003, the content of which is hereby incorporated by reference into this application.

BACKGROUND OF THE INVENTION

The present invention relates to a semiconductor device and its manufacturing method, and more particularly to a technique that can be effectively applied to the prevention of chipping of semiconductor chips.

In a semiconductor device of a conventional chip size, a semiconductor chip has a configuration mainly consisting of a semiconductor substrate and, formed over the circuit formation surface which is the outer of the inner and outer surfaces of this semiconductor substrate, a multi-layered wiring layer formed by stacking a plurality each of insulating layers and wiring layers, and a surface protecting film so formed as to cover this multi-layered wiring layer (see Patent Reference 1 for example).

Patent Reference 1: Japanese Unexamined Patent Publication No. 2000-294607 (FIG. 3)

SUMMARY OF THE INVENTION

Among recently developed small semiconductor devices including chip scale packages (CSPs), there are CSP type semiconductor devices assembled by manufacturing techniques integrating the wafer process (pre-process) and the packaging process (post-process) (such semiconductor devices are known as wafer level CSP s or wafer process packages).

A wafer level CSP undergoes a burn-in test in its screening procedure. For the test, the CSP is fitted to a socket dedicated for the purpose. First, the semiconductor chip is arranged with its main surface opposite the concave portion of the socket in a state in which the inner surface of the semiconductor chip is suction-held by an arm. The arm is descended in this state to cause the package to advance into the concave portion of the socket, and the suction-holding of the package is discontinued before the package comes into contact with a terminal in the concave portion of the socket, with the package being dropped slightly to be arranged in its due position.

In this process, when the end of the main surface of the semiconductor chip comes into contact with the inner wall of the concave portion, the end of the main surface is chipped. If any of the chipped silicon pieces remains in the concave portion of the socket, there will arise a problem that the protective film over the surface of the semiconductor chip is damaged when the back surface of the semiconductor chip is pressed by the arm at the time of testing, eventually causing the protective film to be peeled off.

Furthermore, if any silicon piece remains in the concave portion of the socket, there will arise another problem that contact failure occurs between the protruding electrodes of the package and the terminals of the socket, inviting a drop in test efficiency and accordingly in test reliability.

Still another problem that will arise is that the chipping invites exposure of wiring inside the semiconductor chip, which would invite corrosion or disconnection of the wiring and thereby make the semiconductor chip fatally defective.

An object of the present invention is to provide a semiconductor device which can prevent chipping, and its manufacturing method.

Another object of the invention is to provide a semiconductor device which can contribute to enhance the efficiency of processing in the screening procedure including the burn-in test and the reliability of the test, and its manufacturing method.

The above-described and other objects and novel features of the present invention will become apparent from the following description in this specification when taken in conjunction with the accompanying drawings.

Typical aspects of the invention disclosed in the present application will be briefly described below.

According to the invention, there is provided a semiconductor device having a main surface, a back surface opposite the main surface, and side surfaces; an integrated circuit formed over the main surface; an insulating film covering the main surface; a plurality of electrodes exposed from the insulating film and arrayed over the main surface with first spacing; a plurality of wirings formed over the insulating film, one-end part of each of which is electrically connected to the plurality of electrodes and the other-end part of each of which is arrayed with second spacing greater than the first spacing; and a plurality of protruding electrodes arranged over the other-end part of the plurality of wirings, each being electrically connected to the other-end part to the plurality of wirings, wherein an inclined surface continuous from the main surface to the side surfaces is formed on a periphery of the main surface of the semiconductor chip.

According to the invention, there is provided a semiconductor device manufacturing method comprising the steps of preparing a semiconductor device provided with a main surface, a plurality of electrodes arranged over the main surface, a rearrangement wiring, formed over the main surface, for rearranging each of the plurality of electrodes, a semiconductor chip having an inclined surface formed on a periphery of the main surface and obliquely continuous to the main surface, and a plurality of protruding electrodes each connected to the rearrangement wiring and arranged differently from the plurality of electrodes; arranging the semiconductor device in a concave portion of a socket in a state in which the main surface of the semiconductor chip is directed toward a bottom surface of the concave portion; and subjecting the semiconductor device to electrical inspection in a state in which the semiconductor device is fitted in the concave portion of the socket.

According to the invention, there is also provided a semiconductor device manufacturing method comprising the steps of preparing a semiconductor wafer having a main surface, a plurality of electrodes arranged over the main surface, a rearrangement wiring, formed over the main surface, for rearranging each of the plurality of electrodes, and a plurality of chip areas each connected to the rearrangement wiring, in each of the areas a plurality of protruding electrodes arranged differently from the plurality of electrodes being formed; forming an inclined surface obliquely continuing to the main surface on a periphery of the main surface of each of the chip areas by first cutting the semiconductor wafer with an angled blade along a dicing area which partitions the chip areas; and forming a plurality of semiconductor devices each having the inclined surface and the plurality of protruding electrodes by performing second cutting with a blade having a less thickness than the angled blade along the dicing area to carry out division into individual pieces, each including the chip area.

According to the invention, there is further provided a semiconductor device manufacturing method comprising the steps of preparing a semiconductor wafer having a main surface, a plurality of electrodes arranged over the main surface, a rearrangement wiring, formed over the main surface, for rearranging each of the plurality of electrodes, and a plurality of chip areas each connected to the rearrangement wiring, in each of the areas a plurality of protruding electrodes arranged differently from the plurality of electrodes being formed; forming an inclined surface obliquely continuing to the main surface on a periphery of the main surface of each of the chip areas by first cutting the semiconductor wafer with an angled blade along a dicing area which partitions the chip areas; forming a plurality of semiconductor devices each having the inclined surface and the plurality of protruding electrodes by performing second cutting with a blade having a less thickness than the angled blade along the dicing area to carry out division into individual pieces, each including the chip area; arranging the semiconductor device in a concave portion of a socket in a state in which the main surface of the semiconductor chip constituting the semiconductor device is directed toward a bottom surface of the concave portion of the socket; and subjecting the semiconductor device to electrical inspection in a state in which the semiconductor device is fitted in the concave portion of the socket.

According to the invention, there is also provided a semiconductor device manufacturing method comprising the steps of preparing a semiconductor device having a main surface, a plurality of electrodes arranged over the main surface, a semiconductor chip formed on a periphery of the main surface and having an inclined surface obliquely continuous to the main surface, and a plurality of protruding electrodes connected to the electrodes; arranging the semiconductor device in a concave portion of a socket in a state in which the main surface of the semiconductor chip is directed toward a bottom surface of the concave portion; and subjecting the semiconductor device to electrical inspection in a state in which the semiconductor device is fitted in the concave portion of the socket.

According to the invention, there is further provided a semiconductor device manufacturing method comprising the steps of preparing a semiconductor wafer having a main surface, a plurality of electrodes arranged over the main surface, and a plurality of chip areas in each of which a plurality of protruding electrodes connected to each of the plurality of electrodes are formed; forming an inclined surface obliquely continuing to the main surface on a periphery of the main surface of each of the chip areas by first cutting the semiconductor wafer with an angled blade along a dicing area which partitions the chip areas; forming a plurality of semiconductor devices each having the inclined surface and the plurality of protruding electrodes by performing second cutting with a blade having a less thickness than the angled blade along the dicing area to carry out division into individual pieces, each including the chip area; arranging the semiconductor device in a concave portion of a socket in a state in which the main surface of the semiconductor chip constituting the semiconductor device is directed toward the bottom surface of the concave portion of the socket; and subjecting the semiconductor device to electrical inspection in a state in which the semiconductor device is fitted in the concave portion of the socket.

Advantages achieved by some of the most typical aspects of the invention disclosed in the present application will be briefly described below.

In a wafer level CSP or a bare chip, the formation of an inclined surface obliquely continuing to the main surface on the periphery of the main surface of the semiconductor chip by bevel cutting serves to ease the contact resistance which arises when the inclined surface comes into contact with the concave portion of a socket at the time of its insertion into the socket during electrical inspection. In addition, the absence of any edge part on the periphery of the main surface of the semiconductor chip can serve to prevent chipping which would otherwise occur when the semiconductor chip is inserted into the socket. As this makes it possible to prevent any silicon piece from remaining in the concave portion of the socket, the reliability of electrical inspection including the burn-in test and the functional test can be improved.

DESCRIPTION OF THE PREFERRED EMBODIMENTS OF THE INVENTION

In the following description of the preferred embodiments of the invention, description of the same or similar parts will not be repeated in principle unless repetition is necessary.

In the following description of the embodiments, though any single embodiment may be referred to as a plurality of sections or embodiments into which it is divided where the convenience of description requires such division, the divided sections or embodiments are not unrelated to one another unless expressly stated otherwise, but each is a modification, details or supplementary explanation of any part or the whole of others.

In the following description of the embodiments, where the number (value, quantity, range or the like) of any element is referred to, its number or the like is not confined to that stated number or the like but any other number of the greater or smaller than that stated one may be acceptable unless confinement is expressly stated or evident from the underlying principle.

Preferred embodiments of the present invention will be described in detail below with reference to drawings. In all the drawings illustrating the embodiments, members having the same function will be denoted by respectively the same reference signs, and their description will not be repeated.

Embodiment 1

Figure 1:
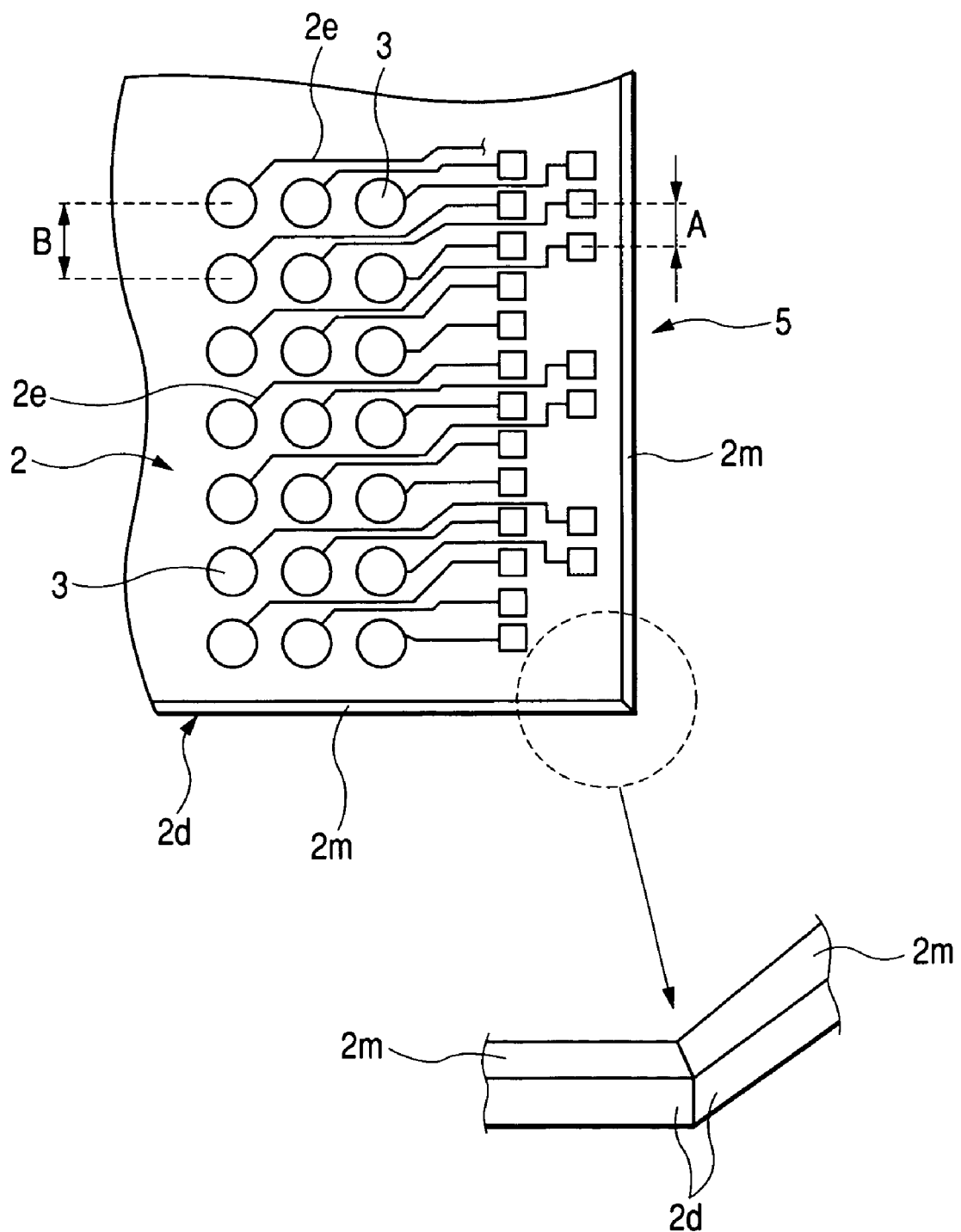
FIG. 1 consists of a partial plan showing one example of structure of a semiconductor device, which is Embodiment 1 of the invention, and an enlarged partial perspective view of a corner part thereof.
Figure 2:
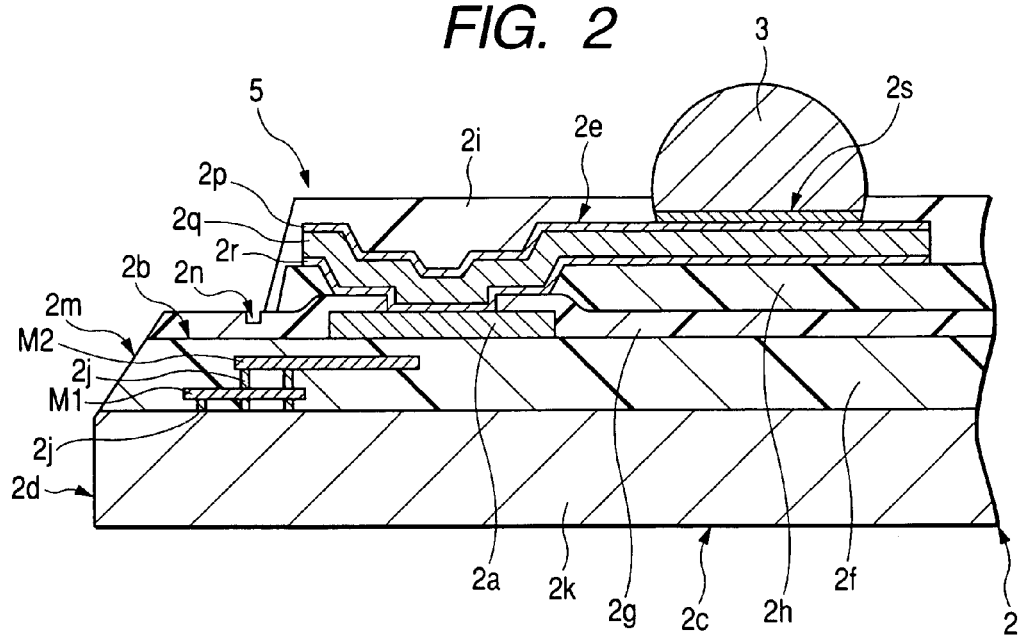
FIG. 2 is an enlarged partial perspective view of one example of structure of the semiconductor device shown in FIG. 1.
Figure 3:
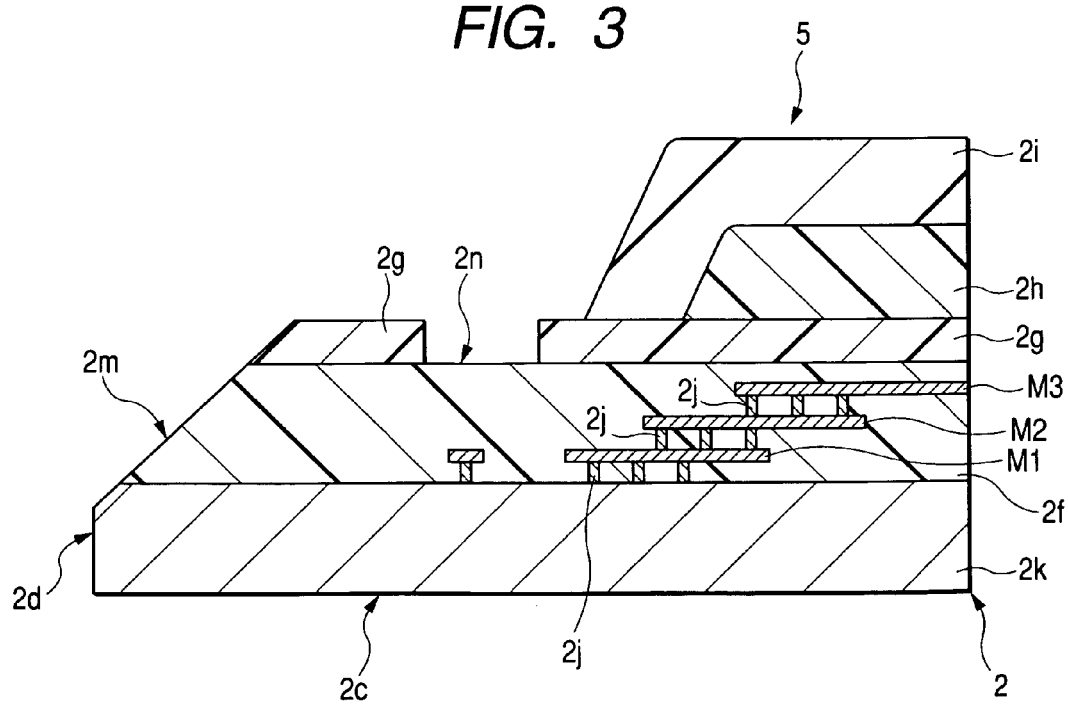
FIG. 3 is an enlarged partial section of the structure near an end of the semiconductor device shown in FIG. 1.
Figure 4:
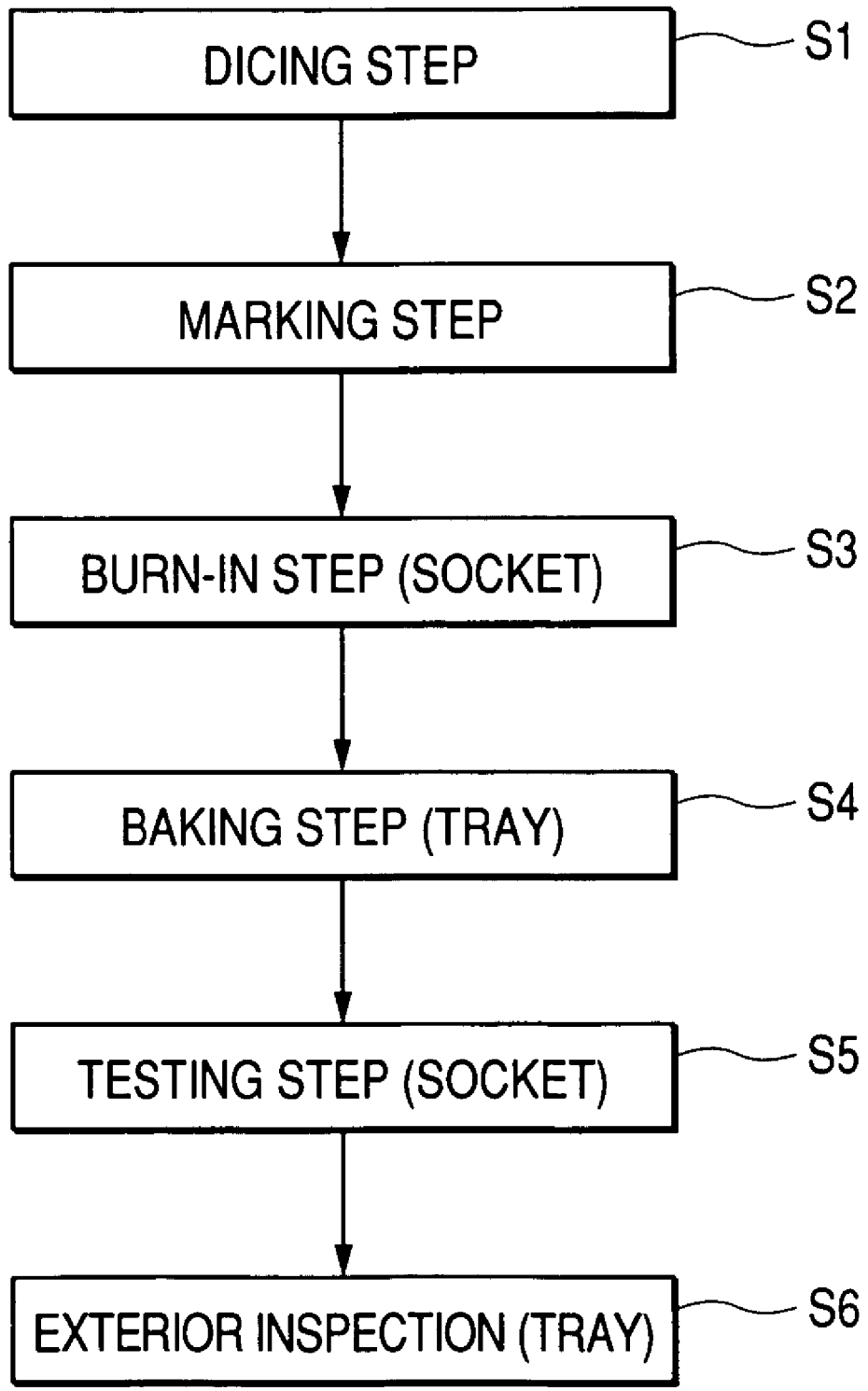
FIG. 4 is a process flowchart of one example of procedure in the post-process of assembly of the semiconductor device shown in FIG. 1.
Figure 5:
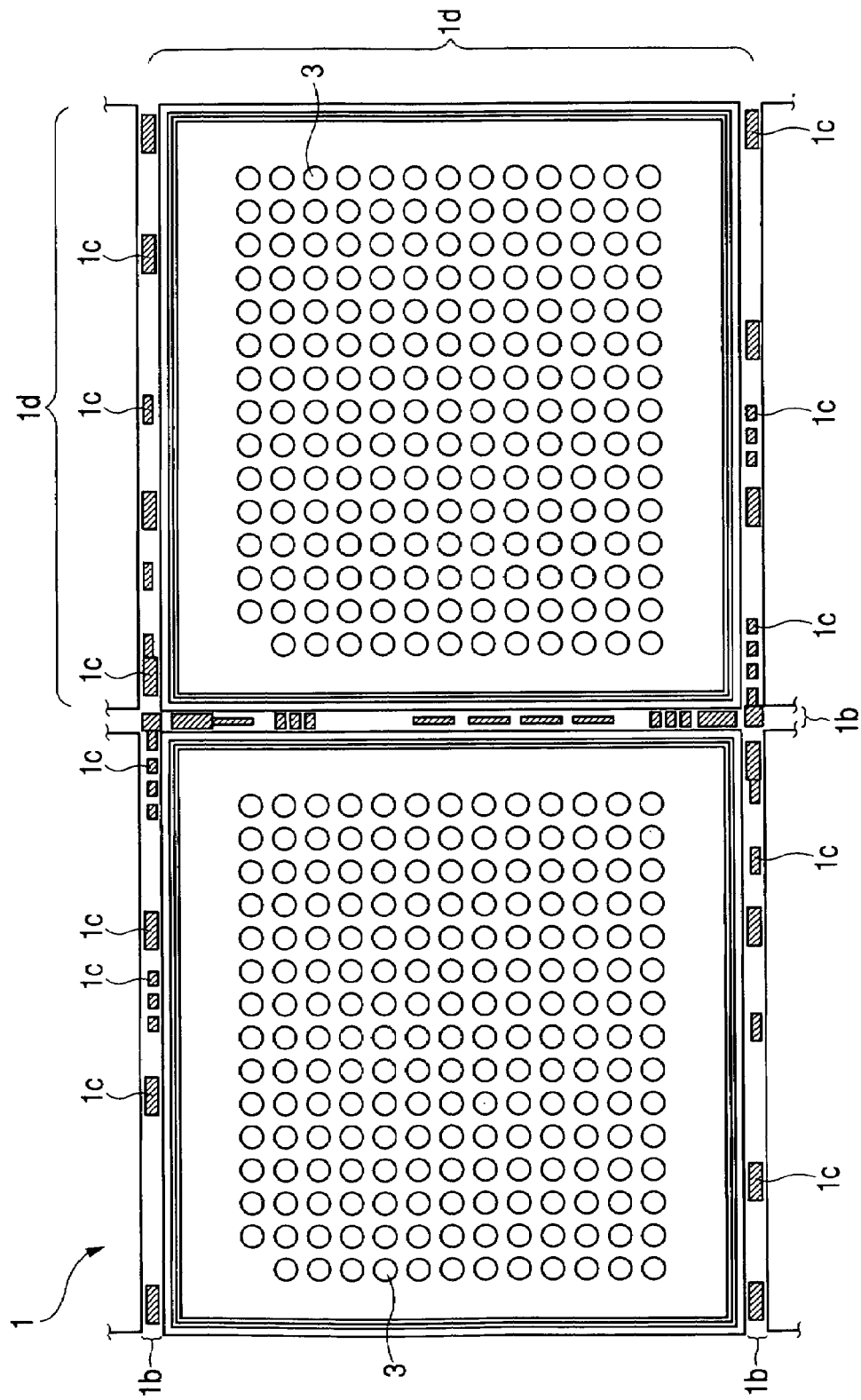
FIG. 5 is an enlarged partial plan of one example of structure of a semiconductor wafer cut at the dicing step of assembly charted in FIG. 4.
Figure 6:
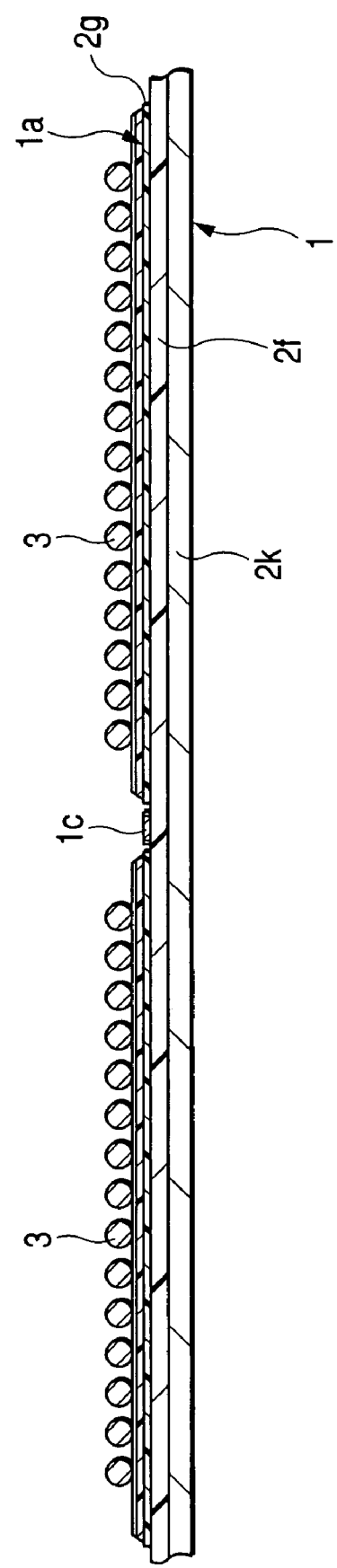
FIG. 6 is an enlarged partial section of the structure of the semiconductor wafer shown in FIG. 5.
Figure 7:
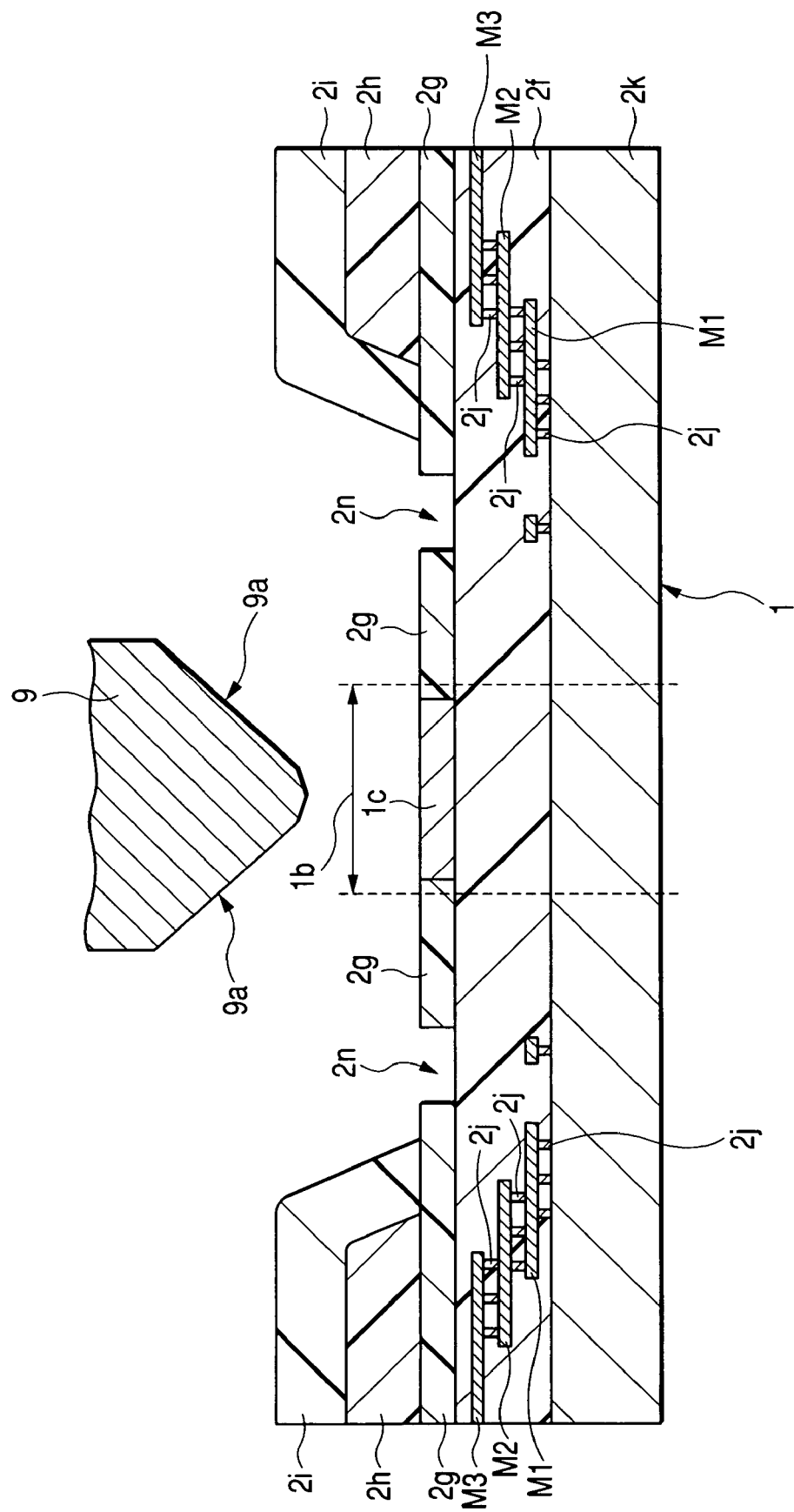
FIG. 7 is an enlarged partial section of one example of structure of the semiconductor wafer before bevel cutting at the dicing step charted in FIG. 4.
Figure 8:
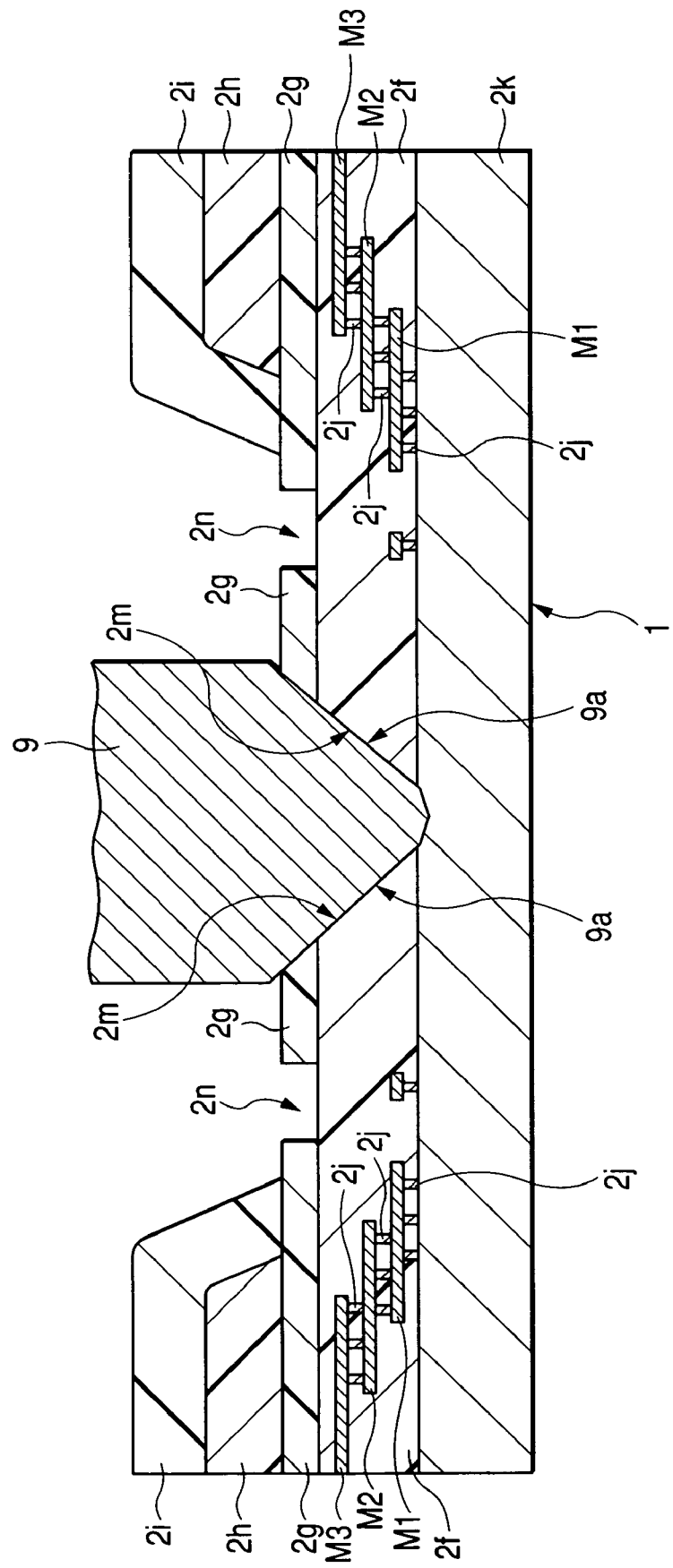
FIG. 8 is an enlarged partial section of one example of state of being cut in a first stage of bevel cutting at the dicing step charted in FIG. 4.
Figure 9:
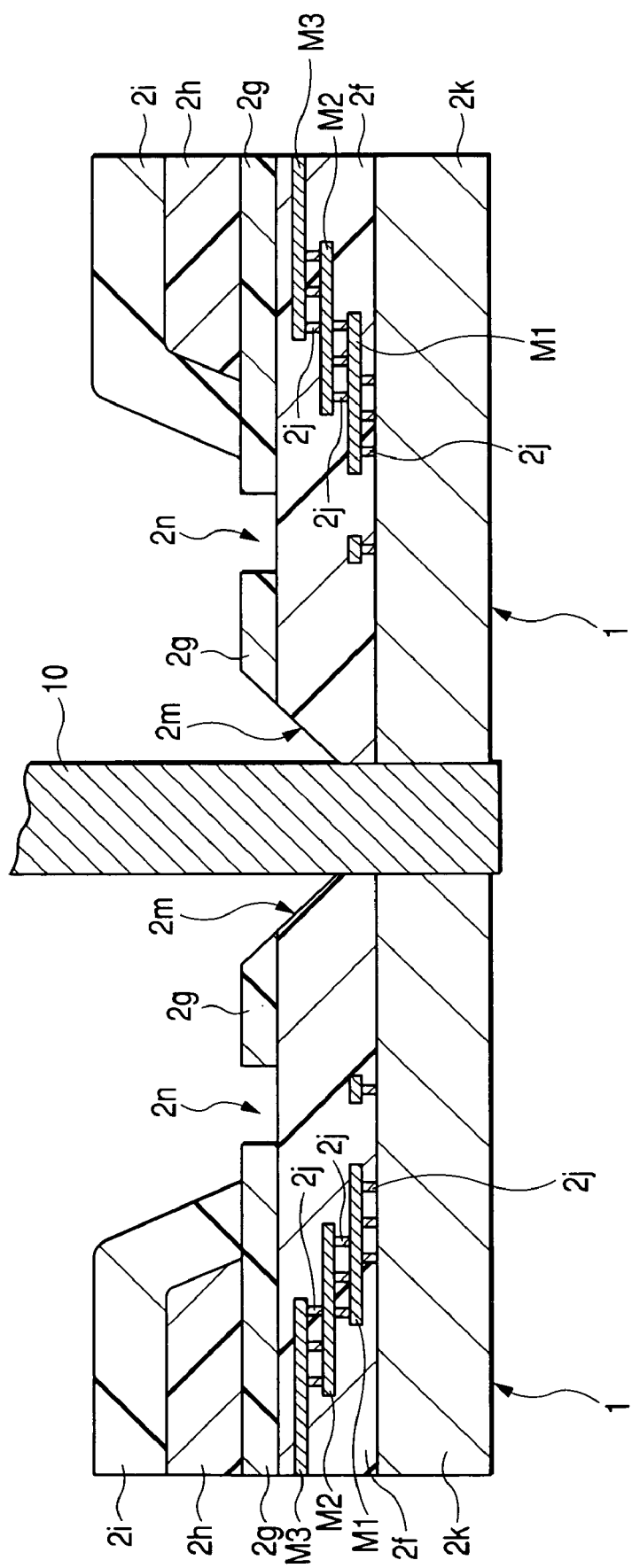
FIG. 9 is an enlarged partial section of one example of state of being cut in a second stage of cutting after the first stage shown in FIG. 8.
Figure 10:
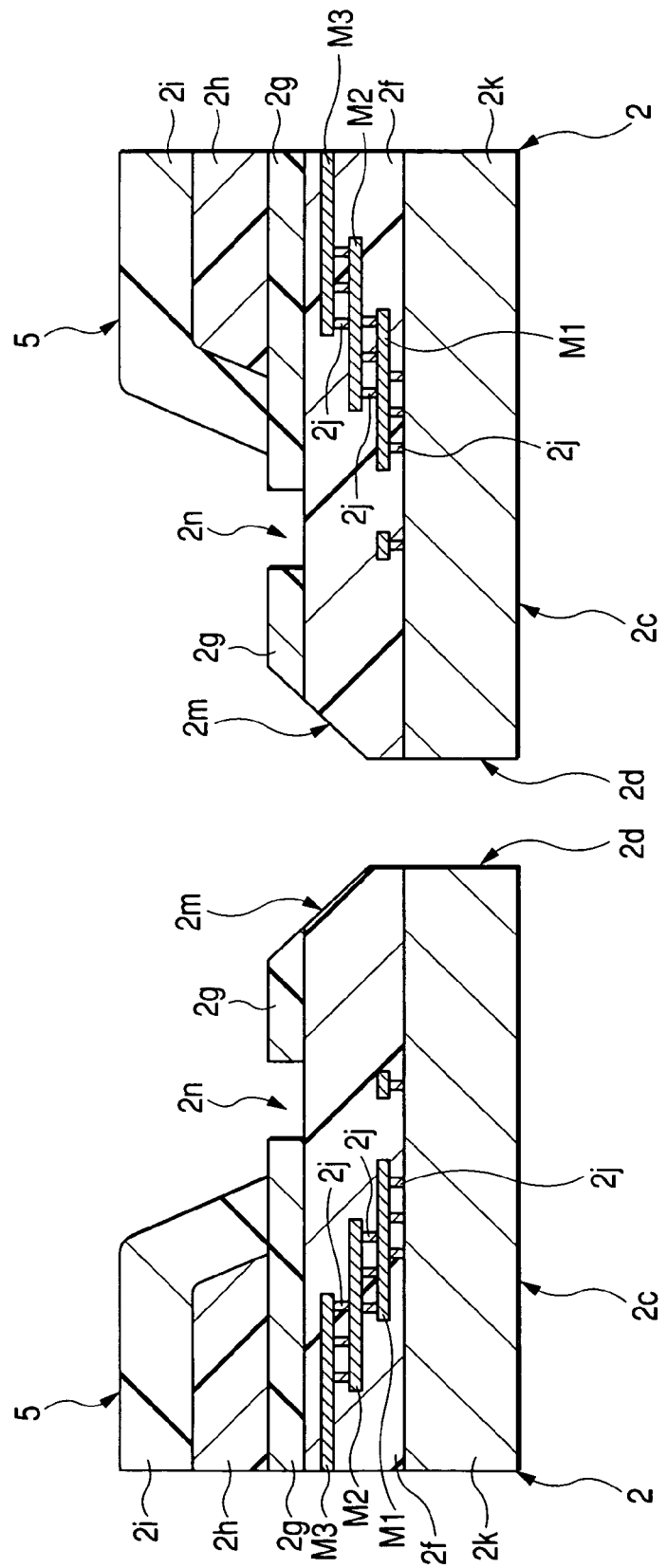
FIG. 10 is an enlarged partial section of one example of structure after the completion of the second stage of cutting shown in FIG. 9.
Figure 11:
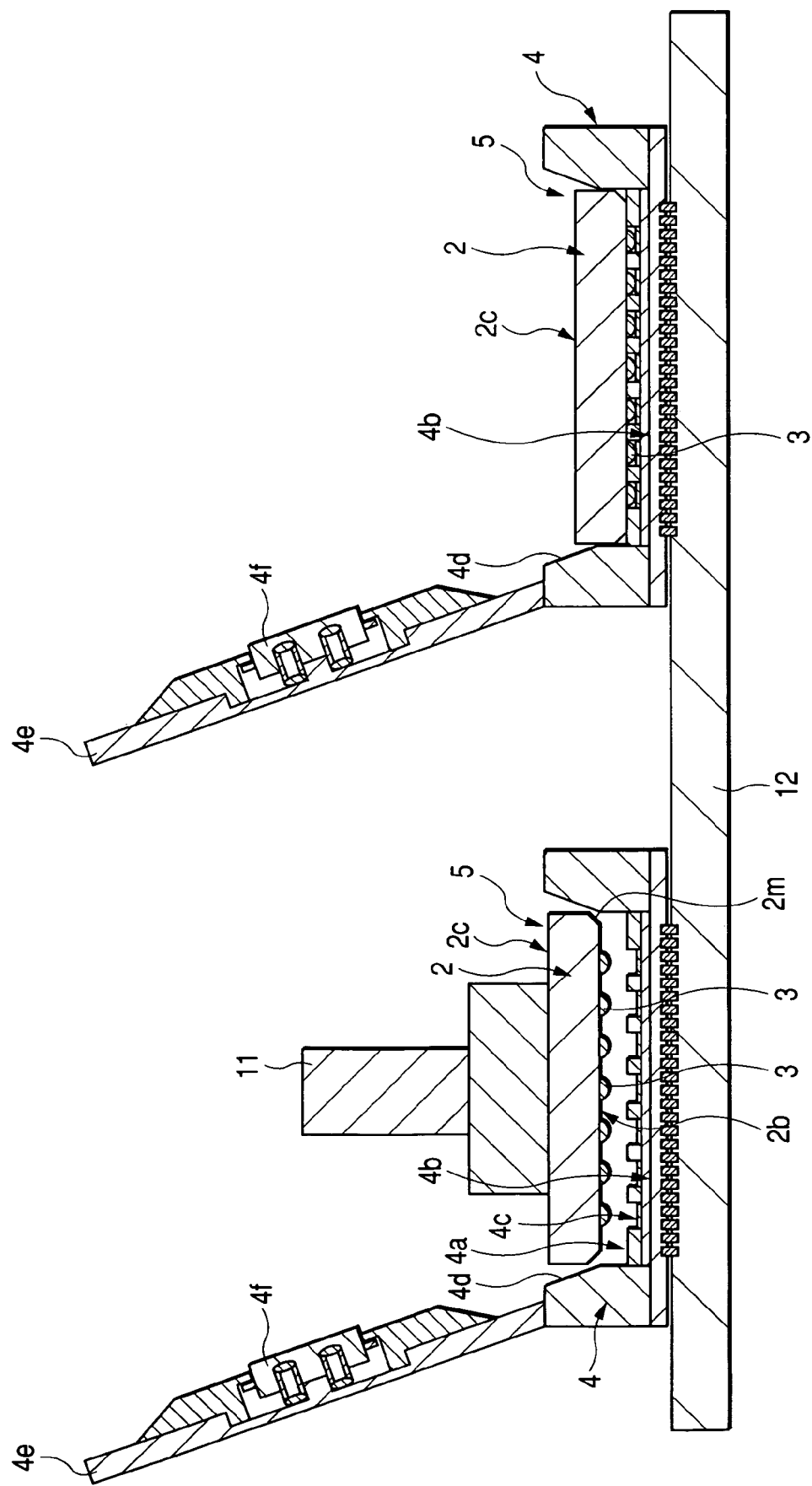
FIG. 11 is a sectional view showing one example of method of fitting the semiconductor device to a socket at the burn-in step of assembly charted in FIG. 4.
Figure 12:
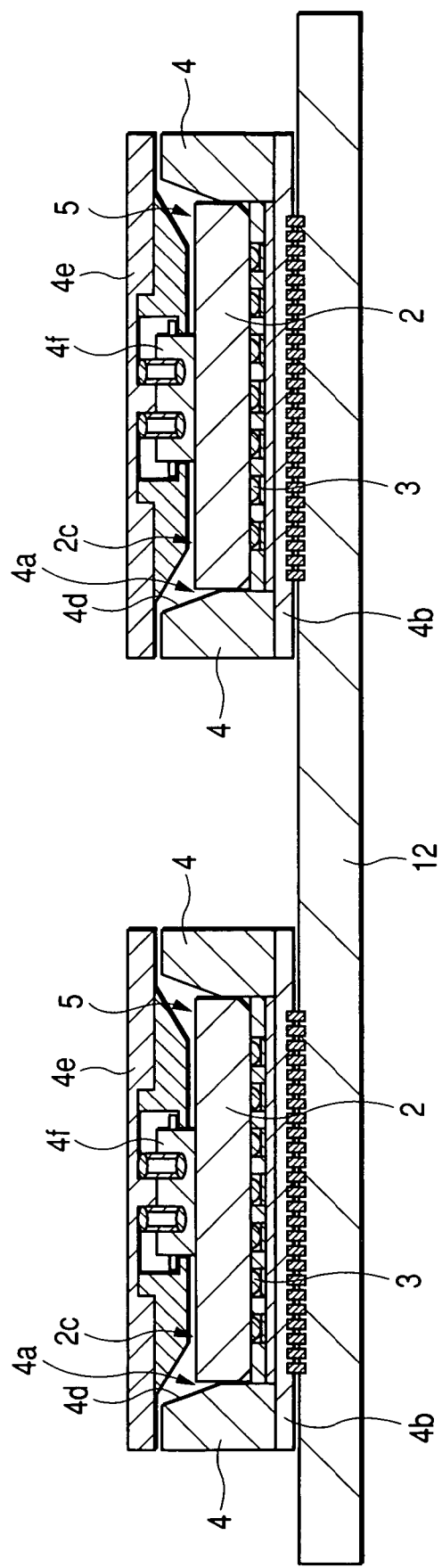
FIG. 12 is a sectional view showing one example of structure after the socket is fitted by the fitting method shown in FIG. 11.
Figure 13:
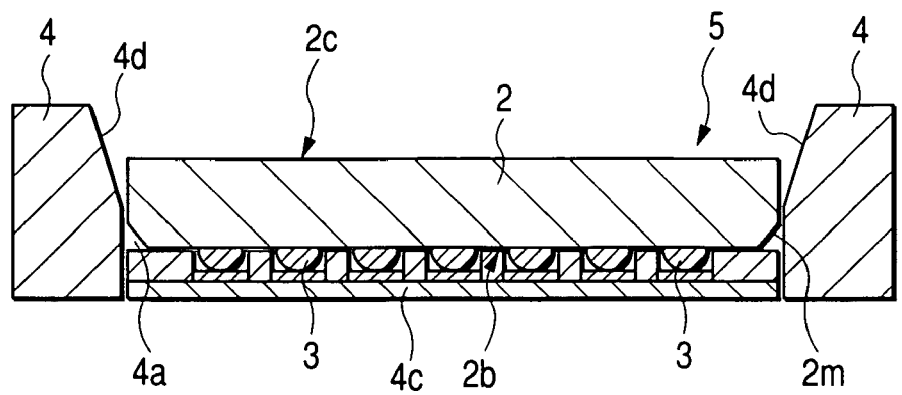
FIG. 13 is a sectional view showing one example of state of contact between the protruding electrodes of the semiconductor device and socket terminals when under burn-in test at the burn-in step of assembly charted in FIG. 4.
Figure 14:
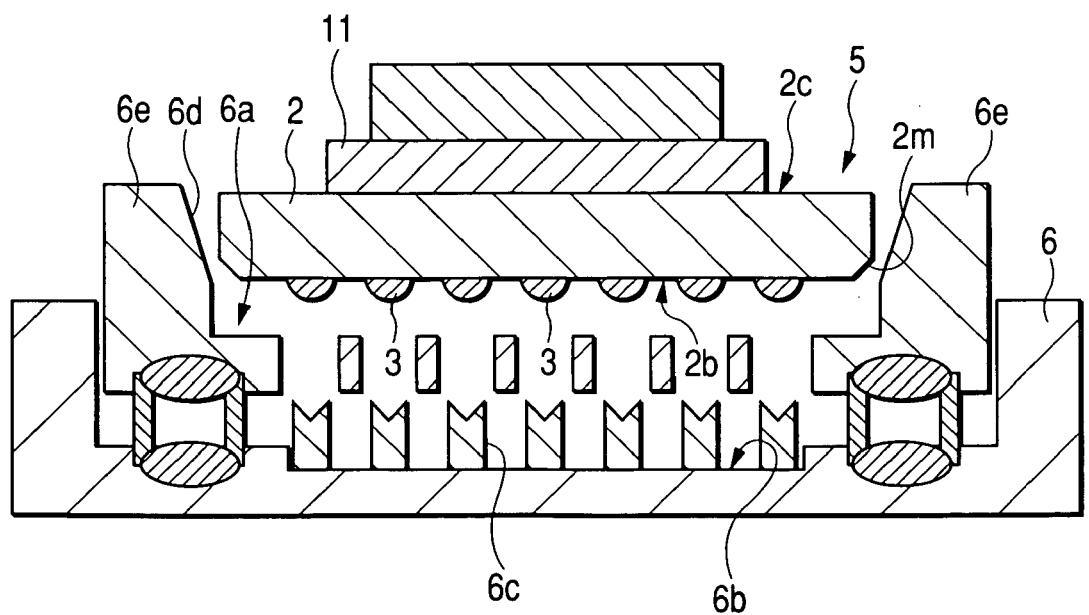
FIG. 14 is a sectional view showing one example of state before the fitting of the socket when the semiconductor device is to be fitted to the socket at the testing step of assembly charted in FIG. 4.
Figure 15:
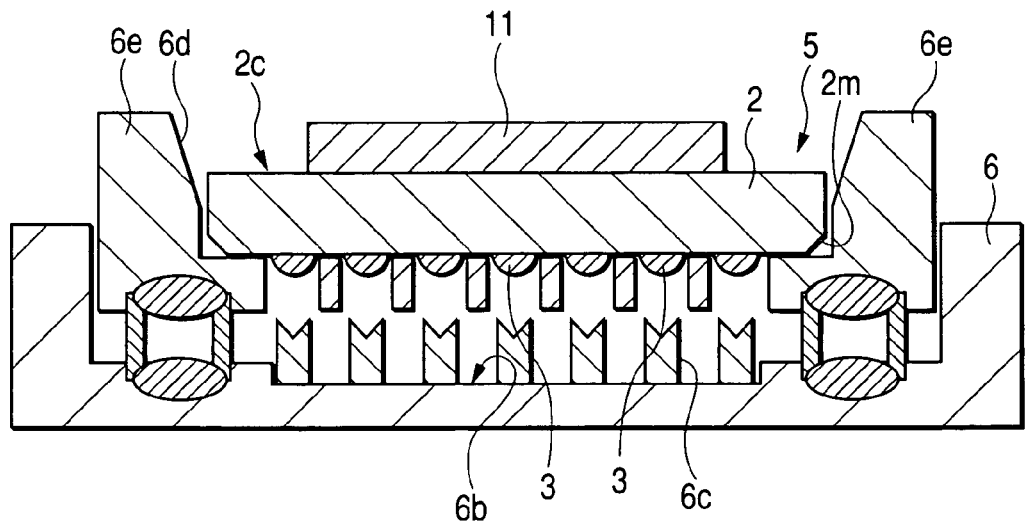
FIG. 15 is a sectional view showing one example of state in which the semiconductor device is fitted to the socket at the testing step of assembly charted in FIG. 4.
Figure 16:
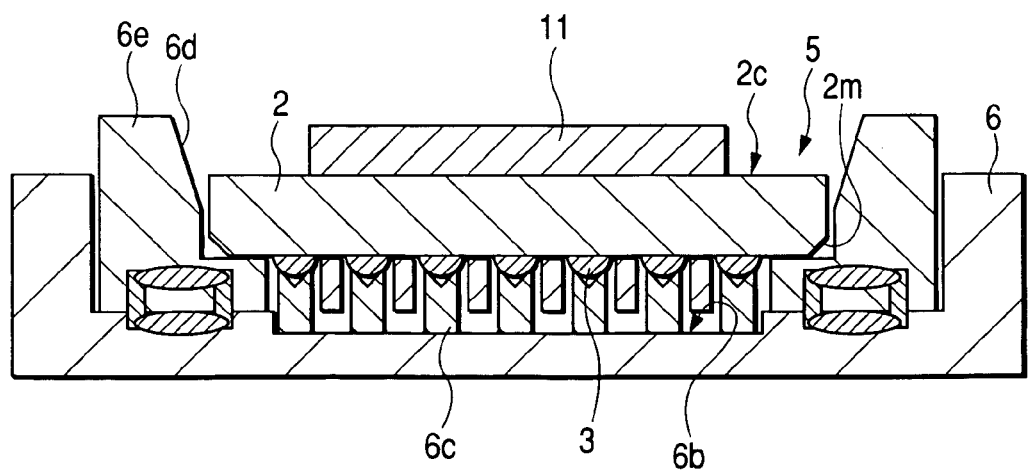
FIG. 16 is a sectional view showing one example of structure after the completion of the fitting of the semiconductor device to the socket at the testing step of assembly charted in FIG. 4.
Figure 17:
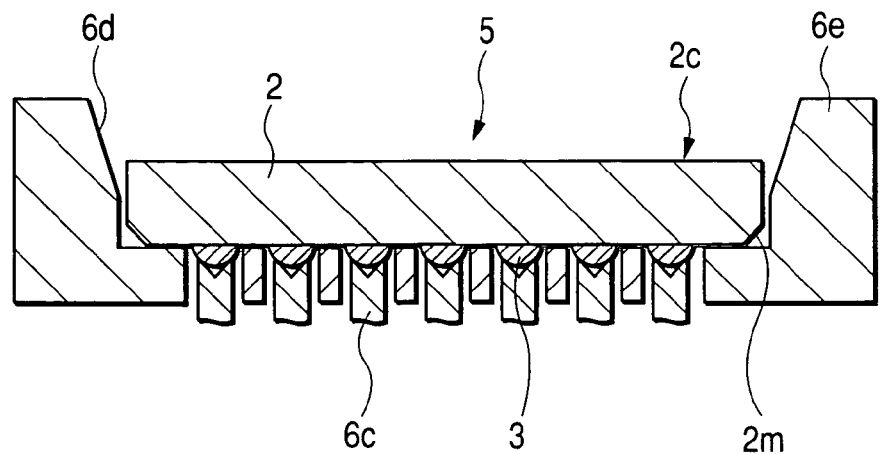
FIG. 17 is a sectional view showing one example of state of contact between the protruding electrodes of the semiconductor device and socket terminals under functional testing at the testing step charted in FIG. 4.
Figure 18:
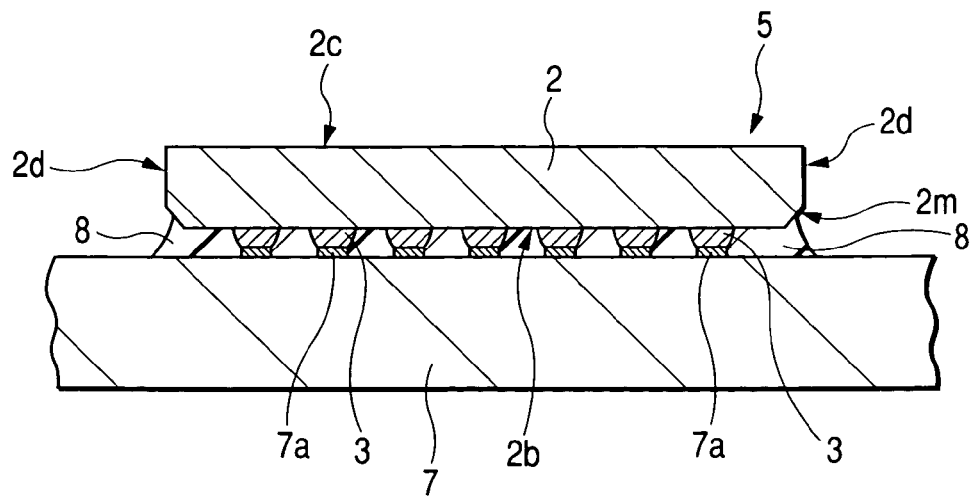
FIG. 18 is a partial section of one example of packaging structure in which the semiconductor device shown in FIG. 1 is mounted over a mount board.
Figure 19:
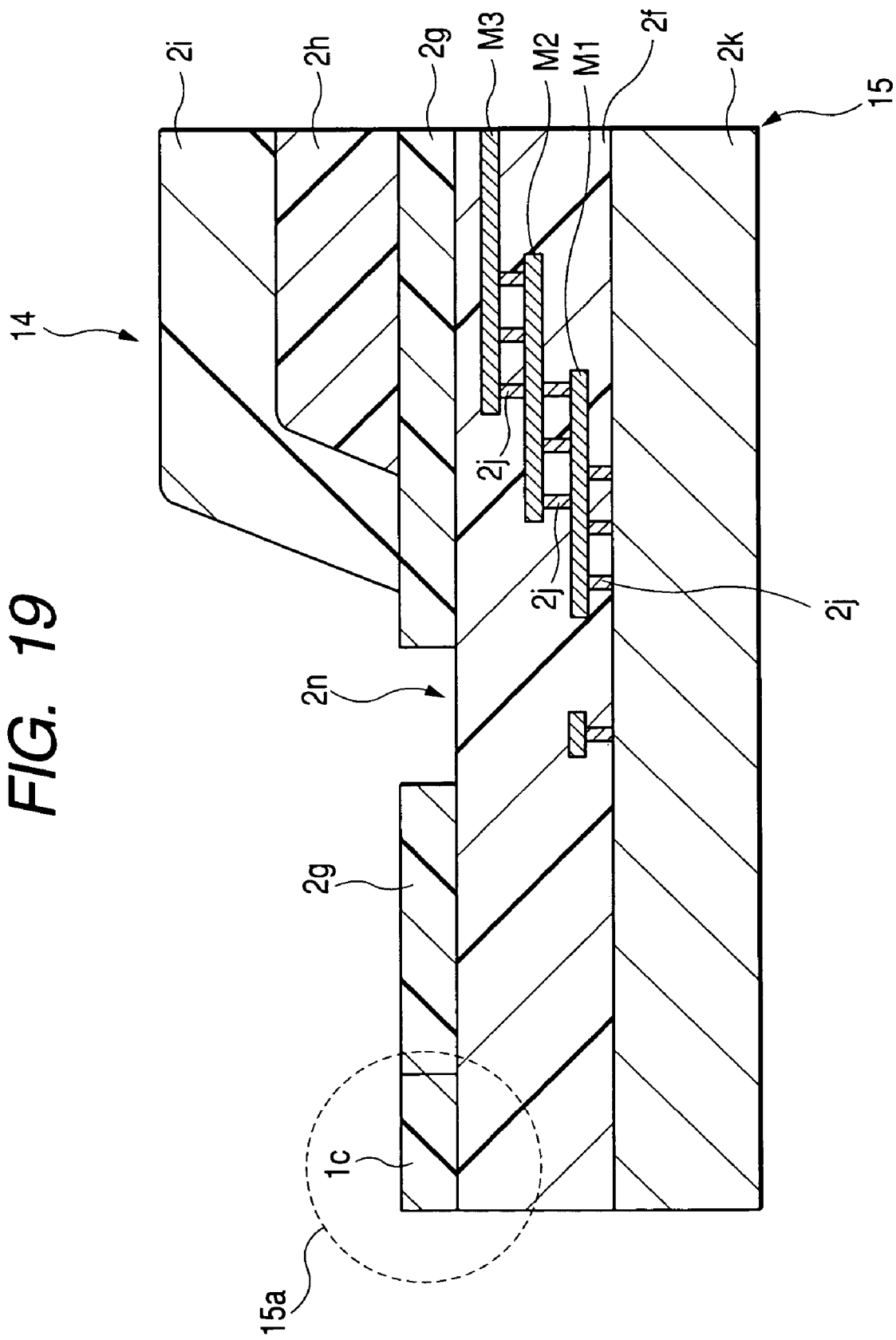
FIG. 19 is an enlarged partial section of the structure of a semiconductor device, which is a comparative example to the semiconductor device shown in FIG. 1.
Figure 20:
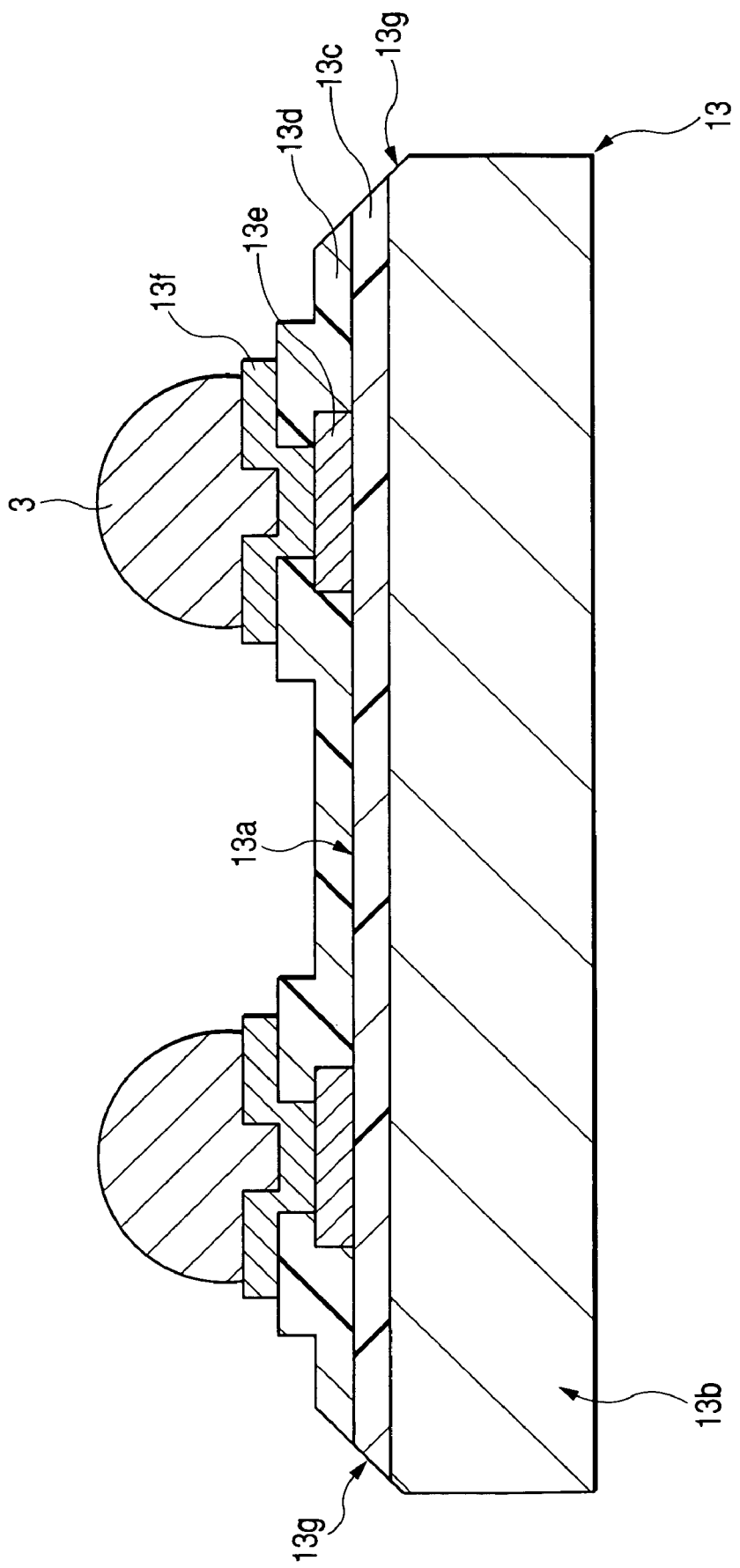
FIG. 20 is a section of one example of structure of a semiconductor device, which is Embodiment 2 of the present invention.

FIG. 1 consists of a partial plan showing one example of structure of a semiconductor device, which is Embodiment 1 of the invention, and an enlarged partial perspective view of a corner part thereof; FIG. 2 is an enlarged partial perspective view of one example of structure of the semiconductor device shown in FIG. 1; FIG. 3 is an enlarged partial section of the structure near an end of the semiconductor device shown in FIG. 1; FIG. 4 is a process flowchart of one example of procedure in the post-process of assembly of the semiconductor device shown in FIG. 1; FIG. 5 is an enlarged partial plan of one example of structure of a semiconductor wafer cut at the dicing step of assembly charted in FIG. 4; FIG. 6 is an enlarged partial section of the structure of the semiconductor wafer shown in FIG. 5; FIG. 7 is an enlarged partial section of one example of structure of the semiconductor wafer before bevel cutting at the dicing step charted in FIG. 4; FIG. 8 is an enlarged partial section of one example of state of being cut in a first stage of bevel cutting at the dicing step charted in FIG. 4; FIG. 9 is an enlarged partial section of one example of state of being cut in a second stage of cutting after the first stage shown in FIG. 8; FIG. 10 is an enlarged partial section of one example of structure after the completion of the second stage of cutting shown in FIG. 9; FIG. 11 is a sectional view showing one example of method of fitting the semiconductor device to a socket at the burn-in step of assembly charted in FIG. 4; FIG. 12 is a sectional view showing one example of structure after the socket is fitted by the fitting method shown in FIG. 11; FIG. 13 is a sectional view showing one example of state of contact between the protruding electrodes of the semiconductor device and socket terminals when under burn-in test at the burn-in step of assembly charted in FIG. 4; FIG. 14 is a sectional view showing one example of state before the fitting of the socket when the semiconductor device is to be fitted to the socket at the testing step of assembly charted in FIG. 4; FIG. 15 is a sectional view showing one example of state in which the semiconductor device is fitted to the socket at the testing step; FIG. 16 is a sectional view showing one example of structure after the completion of the fitting of the semiconductor device to the socket at the testing step; FIG. 17 is a sectional view showing one example of state of contact between the protruding electrodes of the semiconductor device and socket terminals under functional testing at the testing step; FIG. 18 is a partial section of one example of packaging structure in which the semiconductor device shown in FIG. 1 is mounted over a mount board; FIG. 19 is an enlarged partial section of the structure of a semiconductor device, which is a comparative example to the semiconductor device shown in FIG. 1; and FIG. 20 is a section of one example of structure of a semiconductor device, which is Embodiment 2 of the invention.

The semiconductor device of this Embodiment 1 is a wafer level CSP (also called "wafer process package") 5 assembled by a manufacturing technique integrating a wafer process (the pre-process) and a package process (the post-process).

To describe the configuration of the wafer level CSP 5 with reference to FIG. 1 through FIG. 3, it comprises a semiconductor chip 2 having a main surface 2b, an integrated circuit formed over the main surface 2b, pads 2a which are a plurality of electrodes arranged over the main surface 2b, rearrangement wiring 2e formed over the main surface 2b to alter the arrangement of the plurality of pads 2a and an insulating film formed over the main surface 2b, and solder bumps 3 which are a plurality of protruding electrodes each connected to the rearrangement wiring 2e and arranged differently from the plurality of pads 2a, wherein a bevel cut surface 2m, which is an inclined surface obliquely continuous to the main surface 2b, is formed on the periphery of the main surface 2b of the semiconductor chip 2. A spacing A (first spacing) between adjoining pads 2a is 60 µm for instance, and a spacing B (second spacing) between the solder bumps 3 is widened by the rearrangement wiring 2e to 200 µm for instance.

Thus, the semiconductor chip 2 has the bevel cut surface 2m, which is a surface obliquely cut on the periphery of the main surface 2b as shown in the enlarged view of FIG. 1. The bevel cut surface 2m is formed, when the wafer is diced into individual semiconductor chips 2, by chamfering the edge all around by using an angled blade 9 shown in FIG. 7.

This bevel cut surface 2m is intended to prevent, when the wafer level CSP 5 is inserted into a socket in an electrical inspection after the assembly of the wafer level CSP or on a similar occasion, the edge of the main surface 2b of the semiconductor chip 2 from being chipped by its coming into contact with the socket. On that occasion, chipping is more likely to occur in a direction at an angle of 45° to the main surface 2b. This is because the crystal orientation of silicon is at an angle of 45° to the main surface 2b, and it is therefore preferable to so form the bevel cut surface 2m as to avoid making the angle formed by the main surface 2b and the bevel cut surface 2m 45°. Also with a view to sufficiently ease the contact resistance which occurs between the semiconductor chip 2 and the socket when the former is inserted into the latter, it is preferable to so form the bevel cut surface 2m as to make the angle formed by the main surface 2b and the bevel cut surface 2m greater than 45°.

In a wafer level CSP, unlike a semiconductor device formed by packaging a chip with sealing resin or the like, the sides 2d and the back surface 2c of the semiconductor chip 2 are exposed, and accordingly both the sides 2d and the back surface 2c are susceptible to damage due to chipping by silicon pieces. Thus, by making the wafer level CSP 5 immune from chipping, a similar effect can be achieved for the sides 2d and the back surface 2c, too.

Further, in the wafer level CSP 5, the solder bumps (protruding electrodes) 3, which are a plurality of external terminals are arrayed over the main surface 2b of the semiconductor chip 2 as shown in FIG. 1, similarly to a ball grid array (BGA) in appearance.

Further, in the wafer level CSP 5, the rearrangement wiring 2e is further connected to the pads 2a, which are electrodes formed over the main surface 2b of the semiconductor chip 2 as shown in FIG. 2, and the solder bumps 3 are connected to this rearrangement wiring 2e via an Au layer 2s. This rearrangement wiring 2e is intended for the relaying purpose to replace the arrangement of the pads 2a, consisting of aluminum or the like, with an arrangement which permits mounting of the solder bumps 3. Thus in the wafer level CSP 5, as the arrangement pitch of the pads 2a is narrowed and therefore the solder bumps 3, which are external terminals, cannot be mounted directly on the pads 2a, the pitch is widened with the rearrangement wiring 2e to enable the solder bumps 3 to be mounted, and the solder bumps 3 are connected to the rearrangement wiring 2e.

This enables the plurality of solder bumps 3 to be arranged in an array form.

Incidentally, the rearrangement wiring 2e has a three-layered structure comprising an Ni layer 2p, a Cu layer 2q and a Cr layer 2r for instance. The Ni layer 2p, the Cu layer 2q and the Cr layer 2r are arranged in this order inward from the surface side, and the Cr layer 2r are connected to the pads 2a. The Ni layer 2p is connected to the solder bumps 3 via the Au layer 2s for better connection to the solder bumps 3.

Further, above a silicon substrate 2k, there are formed metal wiring layers, each via an insulating layer 2f, which is an inter-layer insulating film as shown in FIG. 3. For instance, over the silicon substrate 2k, there are formed a first layer metal wiring M1, a second layer metal wiring M2 and a third layer metal wiring M3, each via an insulating layer 2f. The first layer metal wiring M1 and the second layer metal wiring M2 are connected to each other, and so are the second layer metal wiring M2 and the third layer metal wiring M3, both via a plug 2j. To add, the third layer metal wiring M3 shown in FIG. 3 corresponds to the wiring layer of the pads 2a in FIG. 2.

Further, as shown in FIG. 2, the pads 2a formed over the main surface 2b are covered by a protective film 2g, which is a passivation film, except in the part it is connected to the rearrangement wiring 2e. Over the protective film 2g, a first insulating film 2h is formed in a laminated way, and over this first insulating film 2h is stacked the rearrangement wiring 2e. Further over the rearrangement wiring 2e, a second insulating film 2i is laminated in a state of being deprived of its connecting parts to the solder bumps 3.

Incidentally, the protective film 2g consists of SiN, for instance, and the first insulating film 2h and the second insulating film 2i consist of polyimide or the like, for example.

In the protective film 2g over the main surface 2b of the semiconductor chip 2, an anti-chipping groove 2n is cut in a position at a prescribed distance (e.g. about tens of μm) from the end of the film as shown in FIG. 3. The presence of this groove 2n can prevent the chipping, if any, from proceeding any farther than the groove 2n.

Now, the bevel cut surface 2m of the semiconductor chip 2 in the wafer level CSP 5 is formed in a state of obliquely crossing partly or wholly, in the thickness direction, of insulating layers (inter-layer insulating films) 2f formed over the top and bottom surfaces of a plurality of wiring layers (the first layer metal wiring M1, the second layer metal wiring M2 and the third layer metal wiring M3 here).

Further, the bevel cut surface 2m is formed outside the wiring arranged outermost of the plurality of wiring layers (e.g. the first layer metal wiring M1, the second layer metal wiring M2 and the third layer metal wiring M3). In other words, the bevel cut surface 2m is formed in the outermost position among the plurality of metal wirings formed over the silicon substrate 2k, where wiring is not cut.

In the wafer level CSP 5 of this Embodiment 1, the formation of the bevel cut surface 2m obliquely continuing to the main surface 2b by bevel cutting (chamfering) on the peripheral part of the main surface 2b of the semiconductor chip 2 can serve to ease the contact resistance which occurs on the semiconductor chip 2 from the coming into contact of the bevel cut surface 2m with the socket when the wafer level CSP 5 is inserted into the socket for burn-in testing in the post-process. In addition, the absence of an edge part 15a (see FIG. 19) on the periphery of the main surface 2b of the semiconductor chip 2 can serve to prevent chipping which would otherwise occur when the wafer level CSP 5 is inserted into the socket.

Moreover, since chipping can be prevented on the periphery of the main surface 2b of the semiconductor chip 2, the protective film 2g over the surface of the semiconductor chip 2 can be prevented from coming off, and the internal metal wiring can be thereby prevented from becoming exposed. Therefore, the semiconductor chip 2 can be prevented from running into a fatal failure due to corrosion or disconnection of the wiring. This makes it possible to enhance the quality and reliability of the wafer level CSP 5 and at the same time to raise the yield of the assembly of the wafer level CSP 5.

Next will be described a manufacturing method of the wafer level CSP 5 (semiconductor device), which is Embodiment 1, with referenced to the process chart of FIG. 4.

First, dicing is performed at the dicing step referred to as step S1.

At this step, as shown in FIG. 5 and FIG. 6, a semiconductor wafer 1 is fabricated, which comprises a main surface 1a, a plurality of pads 2a arranged over the main surface 1a as shown in FIG. 2, rearrangement wiring 2e formed in the upper layer of the main surface 1a and rearranges each of the plurality of pads 2a, and a plurality of chip areas 1d in each of which a plurality of solder bumps 3 each connected to the rearrangement wiring 2e and disposed in a different arrangement from the plurality of pads 2a are formed.

Incidentally, over the main surface 1a of the semiconductor wafer 1, a dicing area 1b which partitions each of the chip areas 1d is formed, and in the dicing area 1b a plurality of test patterns (testing conductors) 1c are further formed.

After that, as shown in FIG. 7, the semiconductor wafer 1 is subjected to first cutting with the angled blade 9 along the dicing area 1b, and the bevel cut surface 2m obliquely continuing to the main surface 1a is formed on the periphery of the main surface 1a each of the chip areas 1d. Incidentally, this first cutting is half cutting to the middle of the thickness of the semiconductor wafer 1 as shown in FIG. 8.

At this cutting step, the semiconductor wafer 1 is half cut with the angled blade 9 having a tapered surface 9a of a prescribed angle so that the angle formed by the main surface 2b of the semiconductor chip 2 and the bevel cut surface 2m after the cutting be greater than 45°.

Further the first cutting described above is accomplished with the angled blade 9 as shown in FIG. 8 not to let the test patterns 1c shown in FIG. 7, formed in the dicing area 1b of the main surface 1a of the semiconductor wafer 1 remain. If the test patterns 1c remained, chipping would arise from there.

After the first cutting, second cutting is performed with a blade 10 shown in FIG. 9, which is less thick than the angled blade 9, along the dicing area 1b similarly to the first cutting. This second cutting is full cutting. This cutting method comprising the first cutting and the second cutting is referred to as bevel cutting.

By performing the bevel cutting, the semiconductor chip 2 is divided into individual pieces, each consisting of a chip area 1d, and a plurality of wafer level CSPs 5 shown in FIG. 10, each having a bevel cut surface 2m and a plurality of solder bumps 3, are formed.

To add, the bevel cut surface 2m is formed in a state of obliquely crossing part or the whole, in the thickness direction, of the insulating layers 2f, which are inter-layer insulating films formed on both surfaces of each of the plurality of metal wiring layers within the semiconductor chip 2. It is formed in a position farther outside the wiring arranged as the outermost wiring among the plurality of metal wiring layers and obliquely relative to the main surface 2b.

After the completion of the dicing step, a desired mark is attached to the wafer level CSP 5 at the marking step referred to as step S2 in FIG. 4.

After the completion of the marking step, the process will advance to the burn-in step referred to as step S3, at which the wafer level CSP 5 is subjected to a burn-in test, which is electrical inspection.

At the burn-in step, first the wafer level CSP 5 is arranged in a concave portion 4a in a state wherein the main surface 2b of the semiconductor chip 2 of the wafer level CSP 5 is directed toward the bottom surface 4b of the concave portion 4a of a burn-in socket 4 fitted to a burn-in port 12 as shown in FIG. 11. Thus, the wafer level CSP 5 held by a fitting block 11 by suction is arranged over the burn-in socket 4, and the fitting block 11 is brought down toward the burn-in socket 4 to cause the wafer level CSP 5 to enter into the concave portion 4a of the burn-in socket 4. After its entrance, the holding of the wafer level CSP 5 by suction is stopped just before the wafer level CSP 5 comes into contact with a contact sheet 4c of the concave portion 4a, and the wafer level CSP 5 is thereby dropped slightly to be arranged in the concave portion 4a.

In this process, since the wafer level CSP 5 of this Embodiment 1 has the slanted bevel cut surface 2m formed by bevel cutting on the periphery of the main surface 2b of the semiconductor chip 2, when it is inserted into the burn-in socket 4, even if the chip end comes into contact with the inner wall 4d of the concave portion 4a of the burn-in socket 4, the contact resistance working on the semiconductor chip 2 can be eased. Occurrence of chipping can be thereby prevented.

Further, since no edge part 15a like what is formed on the semiconductor chip 15 of the wafer level CSP 14 of the comparative example shown in FIG. 19 is formed on the periphery of the main surface 2b of the semiconductor chip 2, prevention of chipping at the time of insertion into the burn-in socket 4 can be further ensured.

After that, the wafer level CSP 5 is subjected to a burn-in test in a state in which the wafer level CSP 5 is fitted in the concave portion 4a with the lid 4e of the burn-in socket 4 closed as shown in FIG. 12. The burn-in test is performed in a state in which the back surface 2c of the semiconductor chip 2 is pressed against the bottom surface 4b of the concave portion 4a of the burn-in socket 4 by a pressing portion 4f disposed within the lid 4e.

The burn-in test is carried out under conditions of, for instance, 125±5° C. in temperature, duration of 32 hours, Vdd=4.6±0.2 V and Vpp=7.0±0.2 V. The test conditions, however, are not limited to these.

Since the wafer level CSP 5 of this Embodiment 1 can be prevented from chipping, it is possible to prevent silicon pieces from dropping into and remaining in the concave portion 4a of the burn-in socket 4. As a result, as shown in FIG. 13, when the burn-in test is to be performed by bringing the solder bumps 3 of the wafer level CSP 5 into contact with the contact sheet 4c, which is a terminal of the burn-in socket 4, contact failure can be prevented from occurring between the solder bumps 3 and the contact sheet 4c, and the reliability of the burn-in test can be therefore enhanced.

Moreover, since contact failure can be prevented as stated above, the efficiency of processing in the screening procedure including the burn-in test can be enhanced.

Further, as no silicon piece remains in the concave portion 4a of the burn-in socket 4, when the semiconductor chip 2 is pressed from the back surface 2c side during the test, the protective film 2g on the surface of the semiconductor chip 2 can be prevented from being damaged by any silicon piece.

After the completion of the burn-in test, the process will advance to the baking step referred to as step S4 in FIG. 4 to perform baking. The baking in this context means heat treatment on a gate insulating film inside the semiconductor chip 2 for instance. It is performed by taking the wafer level CSP 5 out of the burn-in socket 4 and accommodating it on a tray. It has to be noted, however, that not every product need be subjected to this baking.

After the completion of the baking, the process will advance to the testing step referred to as step S5 to undergo functional testing. Thus, the wafer level CSP 5 is subjected to a functional test.

First, as shown in FIG. 14, the wafer level CSP 5 held by the fitting block 11 by suction is arranged over a test socket (another socket) 6. Then, as shown in FIG. 15, the fitting block 11 is descended toward the test socket 6 to arrange the wafer level CSP 5, in a sucked state, over the concave portion 6a in the pedestal 6e of the test socket 6.

After that, as shown in FIG. 16, the pedestal 6e is fixed to the test socket 6 by locking, and the functional test is carried out in this state. During the test, as shown in FIG. 17, the solder bumps 3 of the wafer level CSP 5 are brought to contact with contact pins 6c, which are terminals disposed on the bottom surface 6b of the test socket 6 to respectively match the solder bumps 3.

Since the wafer level CSP 5 of this Embodiment 1 has the slanted bevel cut surface 2m formed by bevel cutting on the periphery of the main surface 2b of the semiconductor chip 2, when it is inserted into the test socket 6, as in the burn-in test, even if the chip end comes into contact with the inner wall 6d of the concave portion 6a in the pedestal 6e of the test socket 6, the contact resistance working on the semiconductor chip 2 can be eased. Occurrence of chipping can be thereby prevented.

Further, since chipping can be prevented from occurring, it is possible to prevent silicon pieces from dropping into and remaining in the concave portion 6a in the pedestal 6e of the test socket 6 or onto and on the contact pins 6c. As a result, as shown in FIG. 17, when the functional test is to be performed by bringing the solder bumps 3 of the wafer level CSP 5 into contact with the contact pins 6c of the test socket 6, contact failure can be prevented from occurring between the solder bumps 3 and the contact pins 6c, and the reliability of the functional test can be therefore enhanced.

Moreover, since contact failure can be prevented as stated above, the efficiency of processing in the screening procedure including the functional test can be enhanced.

Further, as no silicon piece remains the pedestal 6e or on the contact pins 6c, when the semiconductor chip 2 is pressed from the back surface 2c side, the protective film 2g on the surface of the semiconductor chip 2 can be prevented from being damaged by any silicon piece. In this process, even if a semiconductor chip 2 having no bevel cut surface 2m does not suffer chipping when it is inserted into the test socket 6, it may still suffer chipping because the back surface 2c of the semiconductor chip 2 is pressed at the testing step. Unlike such a case, as this Embodiment 1 has the bevel cut surface 2m, chipping due to the pressing of the back surface 2c of the semiconductor chip 2 can also be prevented.

The steps from S3 until S5 described above may be collectively referred to as the screening procedure.

After the completion of the functional test, the process will advance to the exterior inspection referred to as step S6 in FIG. 4. The exterior inspection is carried out in a state wherein the wafer level CSP 5 is taken out of the test socket 6 and accommodated on a tray. This completes the assembly of the wafer level CSP 5.

To add, as shown in FIG. 18, when the wafer level CSP 5 is to be packaged over amount board 7, for instance it is mounted by solder reflowing, and lands 7a of the mount board 7 and the solder bumps 3 are connected by soldering. Furthermore, under-fill sealing is accomplished with sealing resin 8.

As a variation of the manufacturing method of the semiconductor device of this Embodiment 1, a wafer level CSP (semiconductor device) 5 provided with a semiconductor chip 2 on which a bevel cut surface 2m is formed by bevel cutting can be made ready in advance, and this wafer level CSP 5 can be fitted to a burn-in socket 4 to be subjected to a burn-in test, possibly followed by its fitting to a test socket 6 for functional testing. In either case, chipping can be prevented, and the reliability of testing, including electrical inspection using a socket, can be enhanced. In addition, since contact failure can be prevented from occurring between the solder bumps 3 of the wafer level CSP 5 and terminals of the socket, the processing efficiency of the screening procedure including the burn-in test and the functional test can be improved.

Embodiment 2

FIG. 20 is a section of one example of structure of a semiconductor device, which is Embodiment 2 of the present invention.

The semiconductor device of this Embodiment 2 shown in FIG. 20 comprises a bare chip 13 having a semiconductor element over its main surface 13a and solder bumps 3, which are a plurality of protruding electrodes disposed over that main surface 13a. An insulating film 13c is formed over a silicon substrate 13b, pads 13e, which are a plurality of electrodes, are formed over the main surface 13a of this insulating film 13c, and the solder bumps 3 are connected to the pads 13e via a barrier metal layer 13f.

Incidentally, in the bare chip 13, metal wiring is formed within the layer of the insulating film 13c, and a bevel cut surface 13g is formed to obliquely cross part or the whole, in the thickness direction, of this layer of the insulating film 13c.

Thus, when dicing the semiconductor wafer 1 (see FIG. 5) to form the bare chip 13, by using the method of bevel cutting described with reference to Embodiment 1, the bevel cut surface 13g can be formed on the bare chip 13.

Incidentally, a protective film 13d consisting of SiN is formed in the layer above the insulating film 13c, namely over the main surface 13a of the bare chip 13, and the circumference of each of the pads 13e is also cover with the protective film 13d except where it is connected to a solder bump 3.

The insulating film 13c consists of $SiO_2$ for instance, the pads 13e, of aluminum for instance, and the solder bumps 3, of a Pb—Sn alloy for instance.

In this semiconductor device having the bare chip 13 and the solder bumps 3, too, the presence of the bevel cut surface 13g serves to prevent chipping, as is the case with the wafer level CSP 5 of Embodiment 1.

Furthermore, since chipping can be prevented, the reliability of testing, including electrical inspection, in which this bare chip 13 is fitted to a socket or the like, can be enhanced. The testing conditions are similar to those described with reference to Embodiment 1.

In addition, since contact failure can be prevented from occurring between the solder bumps 3 of the semiconductor device having a bare chip 13 and the terminals of the socket, the processing efficiency of the screening procedure including the burn-in test and the functional test can be improved.

While the invention accomplished by the present inventors has been described so far in specific terms with reference to preferred embodiments thereof, obviously the invention is not confined to these embodiments, but can be modified in various ways without deviating from its true spirit and scope.

For instance, although the foregoing description of Embodiment 1 referred to a case in which three metal wiring layers are formed in the insulating layer 2f having inter-layer insulating films, the number of layers of the metal wiring may be any other number than three.

The present invention is particularly effective for products in which the semiconductor chip is exposed, such as wafer level CSPs. In packaged products such as ball grid arrays (BGAs), in which the semiconductor chip is sealed with resin, this problem of chipping is unlikely to occur.

The present invention can be suitably applied to electronic devices and semiconductor manufacturing technology.

What is claimed is:

1. A method of manufacturing a semiconductor device, comprising the steps of:
    (a) preparing said semiconductor device, said semiconductor device including a semiconductor chip having a main surface, an inclined surface formed on a periphery of said main surface and inclined with respect to said main surface, a plurality of electrodes formed over said main surface, a protective film formed over said main surface, with openings over said electrodes, a plurality of rearrangement wirings formed over said protective film, and a plurality of protruding electrodes, the plurality of electrodes being arranged differently than the plurality of protruding electrodes, the rearrangement wirings connecting the electrodes to corresponding ones of the protruding electrodes, said protective film having a groove separating a periphery portion of said protective film from a portion of said protective film disposed inwardly from said groove, said inclined surface being exposed to outside the semiconductor device and being formed outwardly from said groove, and said groove being exposed to outside the semiconductor device;

(b) arranging said semiconductor device in a concave portion of a socket in a state such that said main surface of said semiconductor chip is directed toward a bottom surface of said concave portion; and (c) subjecting said semiconductor device to electrical inspection in a state in which said semiconductor device is fitted in said concave portion of said socket.

2. The method of manufacturing a semiconductor device according to claim 1, wherein step (c) includes performing a burn-in test.

3. The method of manufacturing a semiconductor device according to claim 1, wherein first end portions of said plurality of rearrangement wirings are connected to respective ones of said plurality of electrodes and second end portions of said plurality of rearrangement wirings are connected to respective ones of said plurality of protruding electrodes.

4. The method of manufacturing a semiconductor device according to claim 1, wherein said periphery portion of said protective film is exposed to outside the semiconductor device.

5. A method of manufacturing a semiconductor device, comprising the steps of:

(a) preparing a semiconductor device including a semiconductor chip having a main surface, an inclined surface formed on a periphery of said main surface and inclined with respect to said main surface, a plurality of electrodes formed over said main surface, a protective film formed over said main surface, with openings over said electrodes, and a plurality of protruding electrodes connected to corresponding ones of said electrodes and formed over said protective film, said protective film having a groove separating a periphery portion of said protective film from a portion of said protective film disposed inwardly from said groove, said inclined surface being exposed to outside the semiconductor device and being formed outwardly from said groove, and said groove being exposed to outside the semiconductor device;

(b) arranging said semiconductor device in a concave portion of a socket in a state such that said main surface of said semiconductor chip is directed toward a bottom surface of said concave portion; and (c) subjecting said semiconductor device to electrical inspection in a state in which said semiconductor device is fitted in said concave portion of said socket.

6. The method of manufacturing a semiconductor device according to claim 5, wherein said periphery portion of said protective film is exposed to outside the semiconductor device.

7. A method of manufacturing a semiconductor device comprising:

(a) preparing a semiconductor device including a non-leaded semiconductor chip having a main surface, an inclined surface formed on a periphery of said main surface and inclined with respect to said main surface, a plurality of electrodes formed over said main surface, a protective film formed over said main surface, with openings over said electrodes, and a plurality of protruding electrodes connected to said electrodes, said protective film having a groove separating a periphery portion of said protective film from a portion of said protective film disposed inwardly from said groove, said inclined surface being exposed to outside the semiconductor device and being formed outwardly from said groove, and said groove being exposed to outside the semiconductor device;

(b) arranging said semiconductor device in a concave portion of a socket in a state such that said main surface of said semiconductor chip is directed toward a bottom surface of said concave portion; and (c) subjecting said semiconductor device to electrical inspection in a state in which said semiconductor device is received in said concave portion of said socket.

8. The method of manufacturing a semiconductor device according to claim 7, wherein said plurality of electrodes are arranged differently than said plurality of protruding electrodes.

9. The method of manufacturing a semiconductor device according to claim 7, wherein said periphery portion of said protective film is exposed to outside the semiconductor device.

10. A method of manufacturing a semiconductor device, comprising:

(a) preparing a semiconductor device including a semiconductor chip having a main surface, an inclined surface formed on a periphery of said main surface and inclined with respect to said main surface, a sidewall perpendicular to said main surface and joined to said main surface through said inclined surface, a plurality of electrodes formed over said main surface, a protective film formed over said main surface, with openings over said electrodes, and a plurality of protruding electrodes connected to said electrodes, said protective film having a groove separating a periphery portion of said protective film from a portion of said protective film disposed inwardly from said groove, said inclined surface being exposed to outside the semiconductor device and being formed outwardly from said groove, and said groove being exposed to outside the semiconductor device;

(b) arranging said semiconductor device in a concave portion of a socket in a state such that said main surface of said semiconductor chip is directed toward a bottom surface of said concave portion; and (c) subjecting said semiconductor device to electrical inspection in a state in which said semiconductor device is received in said concave portion of said socket.

11. The method of manufacturing a semiconductor device according to claim 10, wherein said plurality of electrodes are arranged differently than said plurality of protruding electrodes.

12. The method of manufacturing a semiconductor device according to claim 11, wherein said semiconductor chip is non-leaded.

13. The method of manufacturing a semiconductor device according to claim 10, wherein said semiconductor chip is non-leaded.

14. The method of manufacturing a semiconductor device according to claim 10, wherein said periphery portion of said protective film is exposed to outside the semiconductor device.

* * * * *